(12) United States Patent
Shen et al.

(10) Patent No.: US 9,391,267 B2
(45) Date of Patent: *Jul. 12, 2016

(54) METHOD TO ETCH NON-VOLATILE METAL MATERIALS

(71) Applicant: Lam Research Corporation, Fremont, CA (US)

(72) Inventors: Meihua Shen, Fremont, CA (US); Harmeet Singh, Fremont, CA (US); Samantha S. H. Tan, Fremont, CA (US); Jeffrey Marks, Saratoga, CA (US); Thorsten Lill, Santa Clara, CA (US); Richard P. Janek, Oakland, CA (US); Wenbing Yang, Fremont, CA (US); Prithu Sharma, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/818,225

(22) Filed: Aug. 4, 2015

(65) Prior Publication Data

US 2015/0340603 A1    Nov. 26, 2015

Related U.S. Application Data

(63) Continuation of application No. 14/325,911, filed on Jul. 8, 2014, now Pat. No. 9,130,158.

(60) Provisional application No. 61/971,032, filed on Mar. 27, 2014.

(51) Int. Cl.
*H01L 21/00* (2006.01)
*H01L 43/12* (2006.01)
(Continued)

(52) U.S. Cl.
CPC . *H01L 43/12* (2013.01); *C23F 4/00* (2013.01); *H01L 21/02554* (2013.01); *H01L 27/228* (2013.01); *H01L 43/02* (2013.01); *H01L 43/10* (2013.01); *H01L 45/1675* (2013.01)

(58) Field of Classification Search
CPC .................. H01L 21/02554; H01L 21/02472; H01L 21/02628; H01L 27/228; H01L 43/02; H01L 43/10; H01L 43/12; H01L 45/1675
USPC ..................................... 438/3, 102
See application file for complete search history.

(56) References Cited

U.S. PATENT DOCUMENTS

| | | | | |
|---|---|---|---|---|
| 9,130,158 B1 * | 9/2015 | Shen | ......... | H01L 43/12 |
| 2010/0184253 A1 * | 7/2010 | Hirai | ......... | H01L 29/7869 |
| | | | | 438/104 |
| 2012/0244667 A1 * | 9/2012 | Kim | ......... | H01L 21/02554 |
| | | | | 438/158 |

OTHER PUBLICATIONS

U.S. Appl. No. 14/325,911, filed Jul. 8, 2014.
(Continued)

*Primary Examiner* — Kevin M Picardat
(74) *Attorney, Agent, or Firm* — Beyer Law Group LLP

(57) ABSTRACT

A method for etching a stack with at least one metal layer in one or more cycles is provided. An initiation step is preformed, transforming part of the at least one metal layer into metal oxide, metal halide, or lattice damaged metallic sites. A reactive step is performed providing one or more cycles, where each cycle comprises providing an organic solvent vapor to form a solvated metal, metal halide, or metal oxide state and providing an organic ligand solvent to form volatile organometallic compounds.

20 Claims, 9 Drawing Sheets

(51) Int. Cl.
*H01L 21/02* (2006.01)
*H01L 45/00* (2006.01)
*H01L 27/22* (2006.01)
*H01L 43/02* (2006.01)
*H01L 43/10* (2006.01)
*C23F 4/00* (2006.01)

(56) References Cited

OTHER PUBLICATIONS

Notice of Allowance dated Apr. 28, 2015 from U.S. Appl. No. 14/325,911.

* cited by examiner

METHOD TO ETCH NON-VOLATILE METAL MATERIALS

CROSS REFERENCE TO RELATED APPLICATIONS

This application is a continuation of and claims priority under 35 USC §120 to co-pending U.S. patent application Ser. No. 14/325,911 filed on Jul. 8, 2014, entitled "Method to Etch Non-Volatile Metal Materials" which claims priority under 35 U.S.C. §119(e) to U.S. Provisional Patent Application No. 61/971,032, filed on Mar. 27, 2014, entitled "Methods to Etch and to Remove Post Etch Metallic Residue" all of which are hereby incorporated by reference for all purposes.

BACKGROUND OF THE INVENTION

The present invention relates to etching a layer of non volatile materials through a mask during the production of a semiconductor device. More specifically, the present invention relates to etching a metal layers.

During semiconductor wafer processing, features may be etched through a metal layer. In the formation of magnetoresistive random-access memory (MRAM) or resistive random-access memory (RRAM) devices, a plurality of thin metal layers or films may be sequentially etched. For MRAM a plurality of thin metal layers may be used to form metal tunneling junction stacks.

Patterning non-volatile metal materials such as MRAM in a traditional reactive ion etcher (RIE) is challenging due to low volatility of the etch byproducts. The non-volatile sidewall passivation could cause the device short across the magnetic tunneling junction area and degradation of electric performance. Ion Beam Etching (IBE) has been used for MRAM patterning to clean the sidewall and maintain the material integrity. However, IBE is limited by the aspect ratio (<2:1) for advanced technology nodes with high pattern density.

SUMMARY OF THE INVENTION

To achieve the foregoing and in accordance with the purpose of the present disclosure, a method of etching a stack with at least one metal layer in one or more cycles is provided. An initiation step is preformed, transforming part of the at least one metal layer into metal oxide, metal halide, or lattice damaged metallic sites. A reactive step is performed providing one or more cycles, where each cycle comprises providing an organic solvent vapor to form a solvated metal, metal halide, or metal oxide state and providing an organic ligand solvent to form volatile organometallic compounds.

In another manifestation, a method of etching a stack with at least one metal layer in one or more cycles is provided. An initiation step is preformed, transforming part of the at least one metal layer into metal oxide, metal halide, or lattice damaged metallic sites. A reactive step is performed providing an organic solvent vapor to form a solvated metal, metal halide, or metal oxide state or providing an organic ligand solvent to form volatile organometallic compounds.

In another manifestation, a method of etching a stack with at least one metal layer in one or more cycles is provided. An initiation step is preformed, transforming part of the at least one metal layer into metal oxide, metal halide, or lattice damaged metallic sites. A reactive step is performed providing an organic solvent vapor to form a solvated metal, metal halide, or metal oxide state.

In another manifestation, a method of etching a stack with at least one metal layer in one or more cycles is provided. An initiation step is preformed, transforming part of the at least one metal layer into metal oxide, metal halide, or lattice damaged metallic sites. A reactive step is performed providing an organic ligand solvent to form volatile organometallic compounds.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
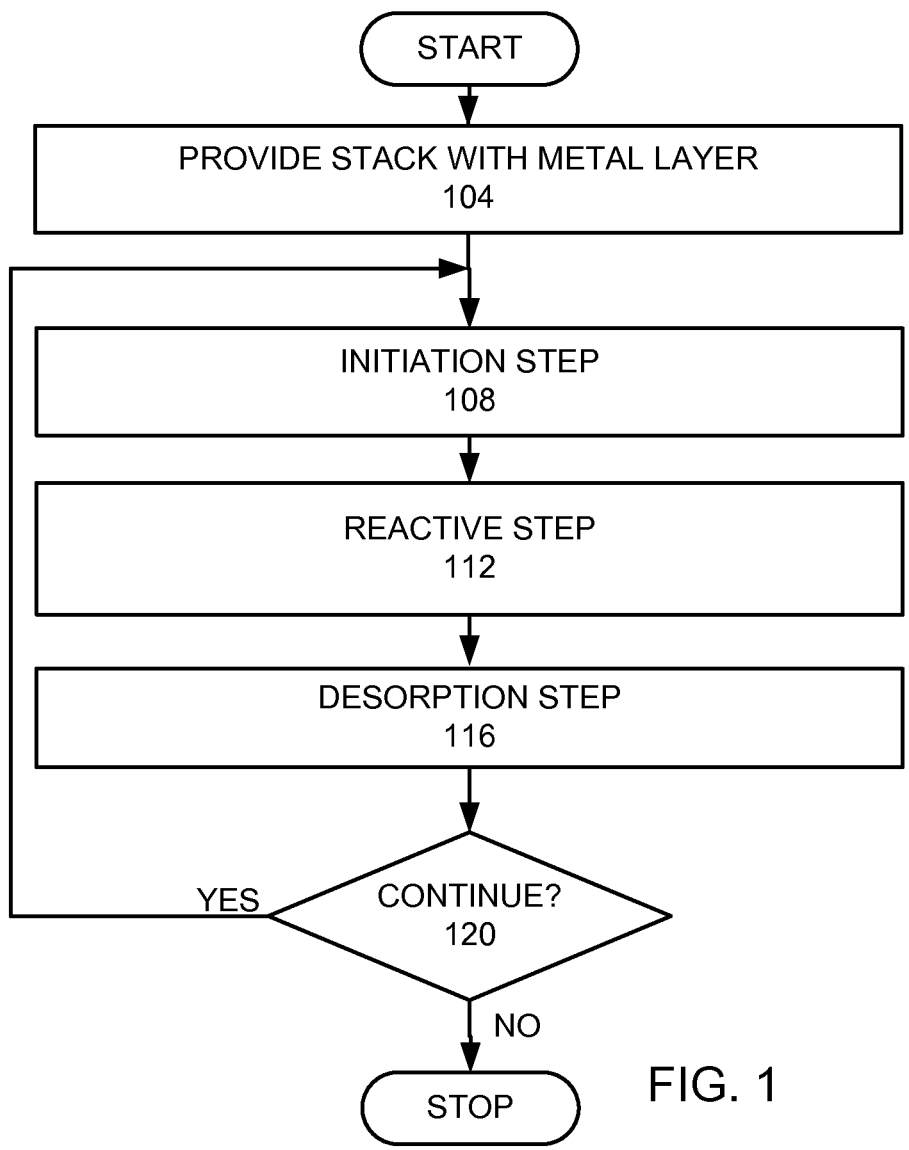
FIG. 1 is a high level flow chart of an embodiment of the invention.

To facilitate understanding, FIG. 1 is a high level flow chart of a process used in an embodiment of the invention. A substrate with a stack with at least one metal containing layer is provided (step 104). An initiation step is provided (step 108). A reactive step is provided (step 112). A desorption step is provided (step 116).

EXAMPLES

Figure 2A:
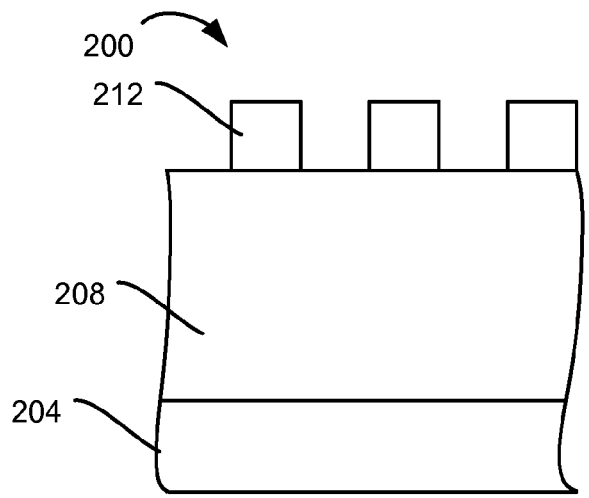
FIGS. 2A-H are schematic views of a stack processed according to an embodiment of the invention.

In an example of a preferred embodiment of the invention, a substrate with a stack with at least one metal layer is provided (step 104). FIG. 2A is a cross-sectional view of a stack 200 over a substrate 204. The stack 200 comprises at least one metal layer 208 disposed below a mask 212. The at least one metal layer 208 may comprise one or more metal layers with non-metal layers. In addition, one or more layers may be disposed between the substrate 204 and the at least one metal layer 208. In addition, one or more layers may be disposed between the at least one metal layer 208 and the mask 212. In this example the at least one metal layer 208 is a tantalum as bottom electrode layer under a platinum manganese (PtMn), or CoPt/CoPd layer, which is a fixed magnetic layer in MRAM film stack.

Figure 3:
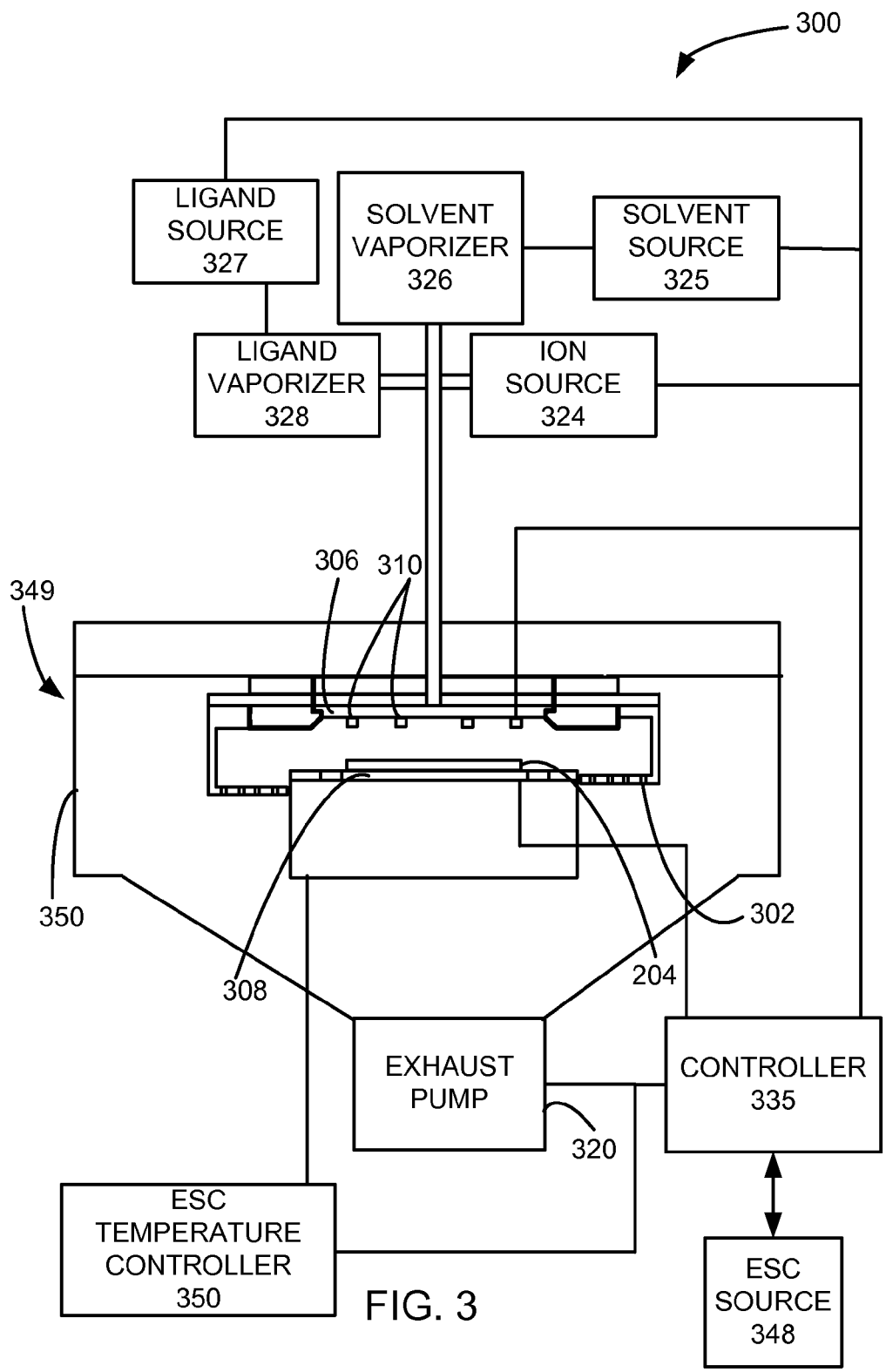
FIG. 3 is a schematic view of an etch reactor that may be used for etching.

In one embodiment, all processing may be performed in a single plasma etch chamber. FIG. 3 is a schematic view of an etch reactor that may be used in practicing such an embodiment. In one or more embodiments of the invention, an etch reactor 300 comprises a gas distribution plate 306 providing a gas inlet and a chuck 308, within an etch chamber 349, enclosed by a chamber wall 350. Within the etch chamber 349, a substrate 204 on which the stack is formed is positioned on top of the chuck 308. The chuck 308 may provide a bias from the ESC source 348 as an electrostatic chuck (ESC) for holding the substrate 304 or may use another chucking force to hold the substrate 204. A heat source 310, such as heat lamps, is provided to heat the metal layer. An ion source 324, a solvent vaporizer 326, and a ligand vaporizer 328 are connected to the etch chamber 349 through the distribution plate 306. A ligand source 327 is connected to the ligand vaporizer 328. A solvent source 325 is connected to the solvent vaporizer 326. An ESC temperature controller is connected to the chuck 308, and provides temperature control of the chuck 308.

Figure 4:
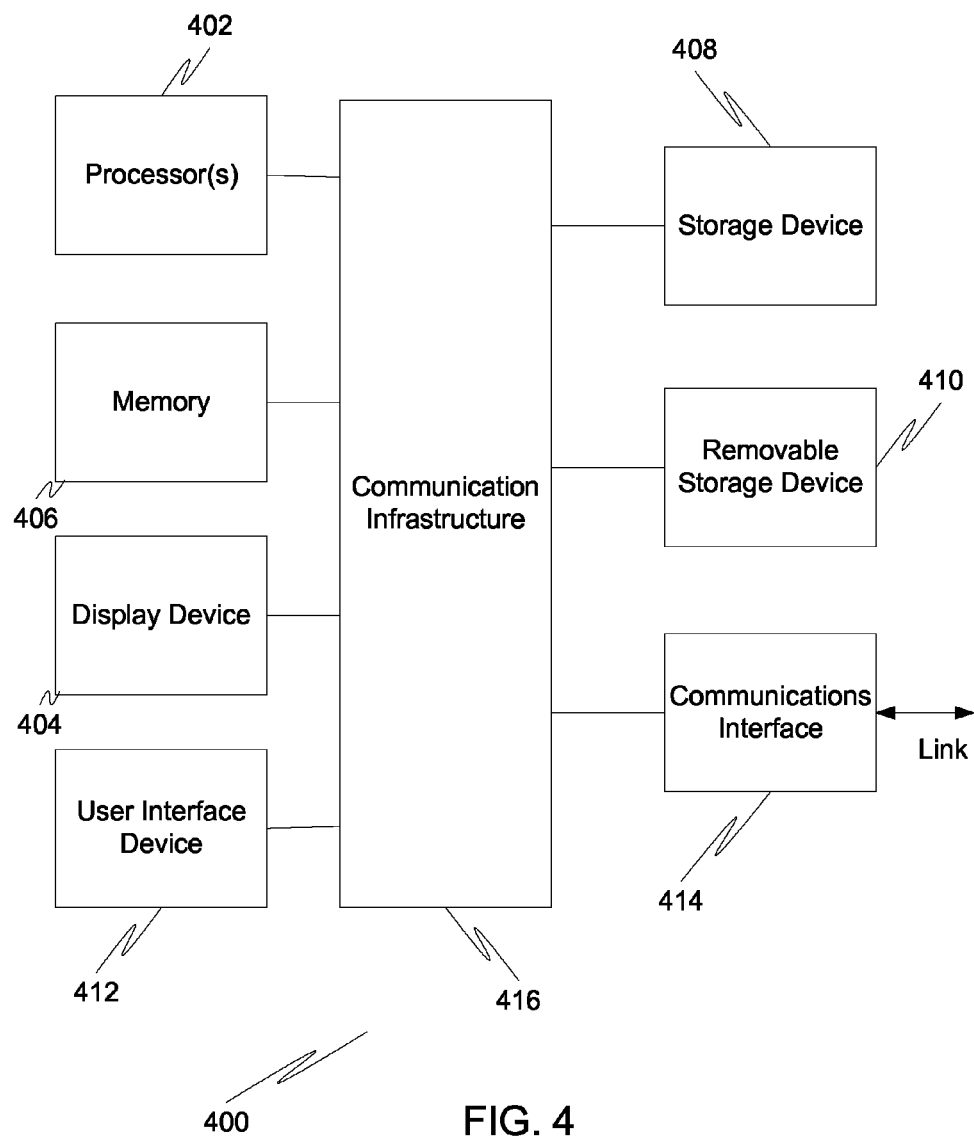
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
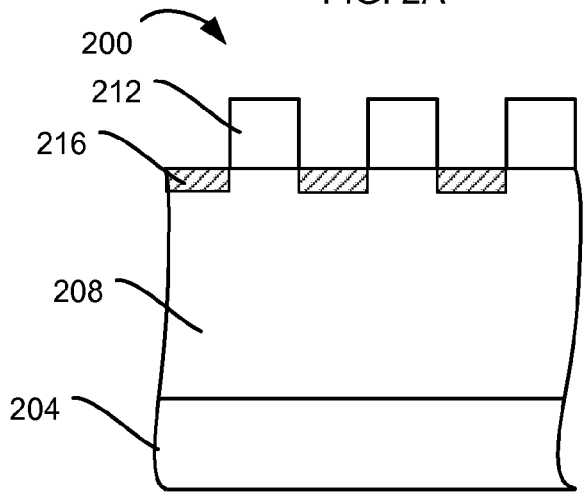

An initiation step is provided (step 108). The initiation step initiates reactive sites transforming part of the at least one metal layer into metal oxide, metal halide, or lattice damaged metallic sites. In this embodiment, the initiation step is provided by using an ionic flux or ion beam to covert part of the at least one metal layer 208 into a metal oxide, metal halide, or lattice damaged metallic sites. In this example, an oxygen plasma or ion beams through IBE can be applied to the wafer surface to oxidize the film not covered by the mask. In another example, a chlorine plasma or low energy inert gas plasma ion can also be applied. FIG. 2B is a cross-sectional view of the stack 200 after the initiation step has been provide (step 108). Unmasked surface layers of the at least one metal layer 208 are exposed to the ionic flux or ion beam and transformed into modified metallic sites 216. In this example, the modified metallic sites 216 are metal transformed into metal oxide, metal halide, or lattice damaged metallic sites. In this example, ions are provided from the ion source 324 into the etch chamber 349.

Figure 2C:
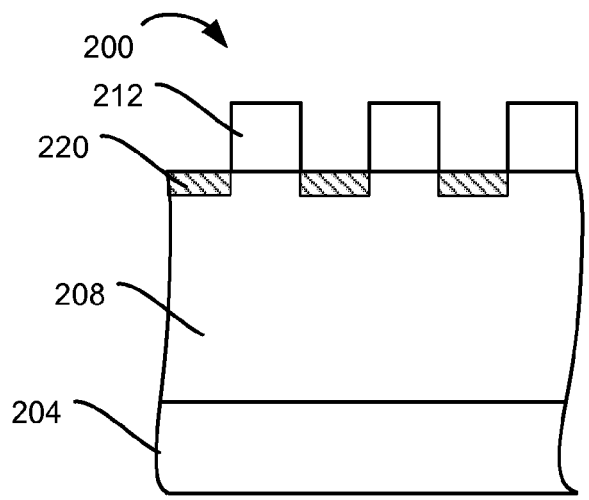
Figure 5:
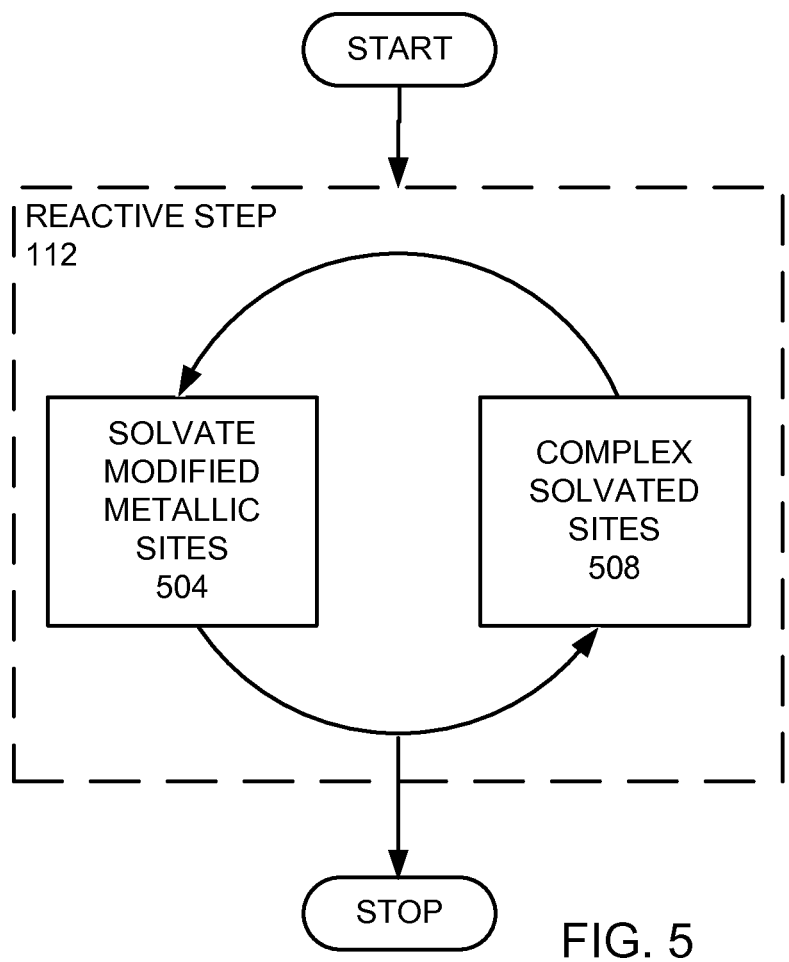
FIG. 5 is a more detailed flow chart of the reactive step.

A reaction step is provided (step 112). FIG. 5 is a more detailed flow chart of providing a reaction step (step 112), which is provided in an embodiment of the invention. In this embodiment, the reaction step (step 112) comprises a solvate modified metallic sites step (step 504) and a ligand complex formation step (step 508). In this embodiment, the solvate modified metallic sites step (step 504) forms solvated metal at the modified metallic sites. In this embodiment, the modified metallic sites are exposed to a vapor solvent. A solvent source 325 provides solvent to the solvent vaporizer 326, which vaporizes the solvent and provides the solvent vapor into the etch chamber 349. Such solvents may be alcohols, amine, or hydrocarbons. Such solvents may be polar or non-polar, base or acidic. Providing a solvated metal is helpful in localizing the metal electron and facilitating the organic ligand attachment. In this embodiment, the ligand complex formation step (step 508) provides ligand vapor which transform the solvated metal into organometallic compounds. A ligand source 327, provides ligands to the ligand vaporizer 328, which vaporizes the ligands and provides the ligand vapor to the etch chamber 349. In this example, the ligand vapor provides organic ligands. The organic ligands that may be used to form ligand complexes may include acetylacetonate (acac) family (such as bis(acac)-EDIM), acetic acid, amides, amidinates (tBuNC(R)Net), allyls, ethylene, acetylene, and cyclo-pentadienyl. In this embodiment, the solvate modified metallic sites step (step 504) and a ligand complex formation step (step 508) are performed cyclically a plurality of times. In other embodiments, the solvate modified metallic sites step and a ligand complex formation step may be performed simultaneously. Where these steps are performed simultaneously, the ligand concentration must by high. FIG. 2C is a cross-sectional view of the stack 200 after the reactive step has been provide (step 112). The modified metallic sites have been transformed into organometallic sites 220. In this embodiment, the ESC temperature controller 350, may be used to cool the chuck 308. In addition, the heat source 310 may be off, so that the stack 200 is kept cooler to increase the deposition of the vapors.

Figure 2D:
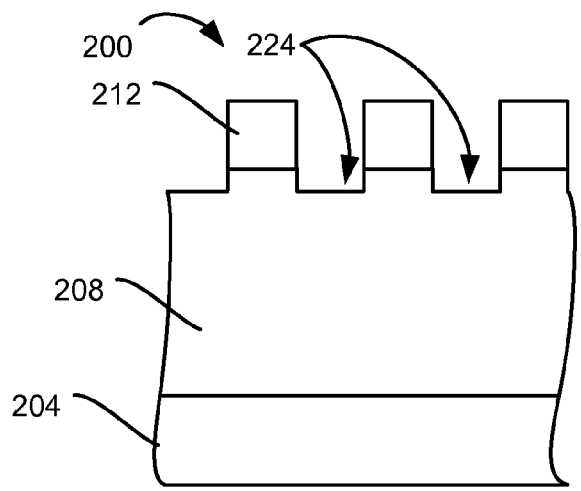

A desorption step is provided (step 116). In this embodiment, the organometallic sites 220 are heated causing the desorption of organometallic material. The heating may be achieved by heating a chuck holding the substrate 204 or by radiation directly heating the organometallic sites 220. In this example, the heat source 310 may use radiant heat to directly heat the organometallic sites 220. The ESC temperature controller 350 may be used to heat the chuck 308, which heats the stack 200. FIG. 2D is a cross-sectional view of the stack 200 after the desorption step has been provide (step 116). The organometallic sites have been removed by desorption, leaving partially etched sites 224.

The desorption step can also be realized with fine controlled ion energy sputtering so the organometallic compounds are detached but the ligands are not detached from metal sites.

Figure 2E:
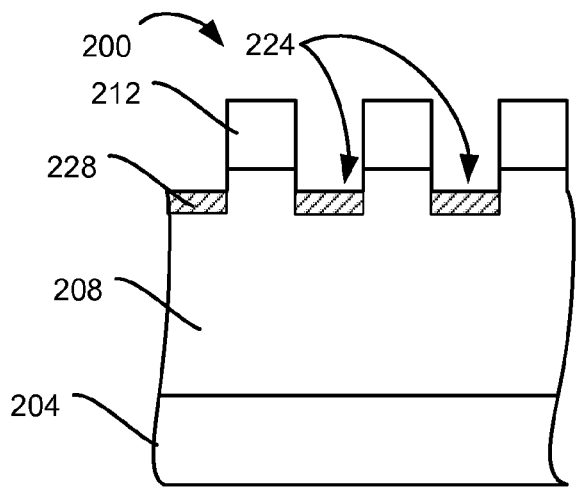

Since the at least one metal layer 208 is only partially etched, the cycle is continued (step 120), which returns to the initiation step (step 108). The same initiation step as described above may be used or the parameters may be changed. FIG. 2E is a cross-sectional view of the stack 200 after the initiation step has been provide (step 108). Unmasked surface layers of the at least one metal layer 208 is exposed to the ionic flux or ion beam and transformed into modified metallic sites 228.

Figure 2F:
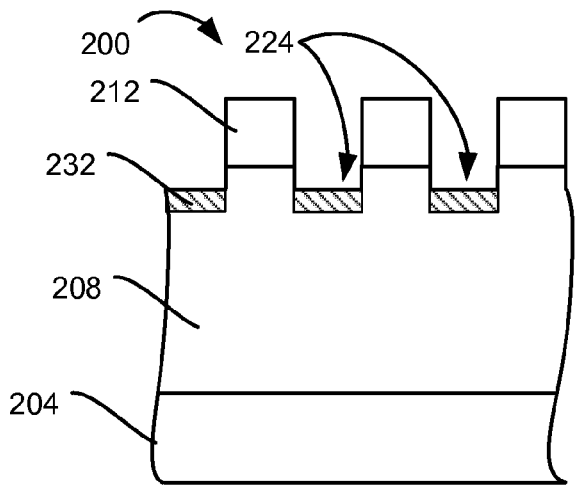

A reaction step is provided (step 112). The same reaction step as described above may be used or parameters may be changed. FIG. 2F is a cross-sectional view of the stack 200 after the reactive step has been provide (step 112). The modified metallic sites have been transformed into organometallic sites 232.

Figure 2G:
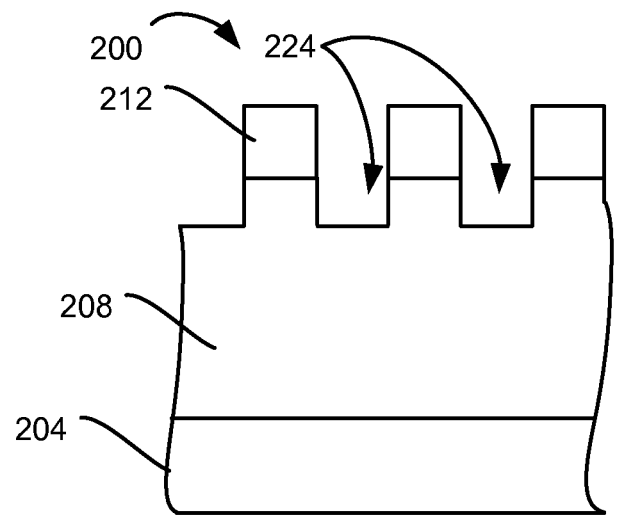

A desorption step is provided (step 116). In this embodiment, the organometallic sites 232 are heated causing the desorption of organometallic material. The same desorption step as described above may be used or parameters may be changed. FIG. 2G is a cross-sectional view of the stack 200 after the desorption step has been provide (step 116). The organometallic sites have been removed by desorption, leaving partially etched sites 224.

Figure 2H:
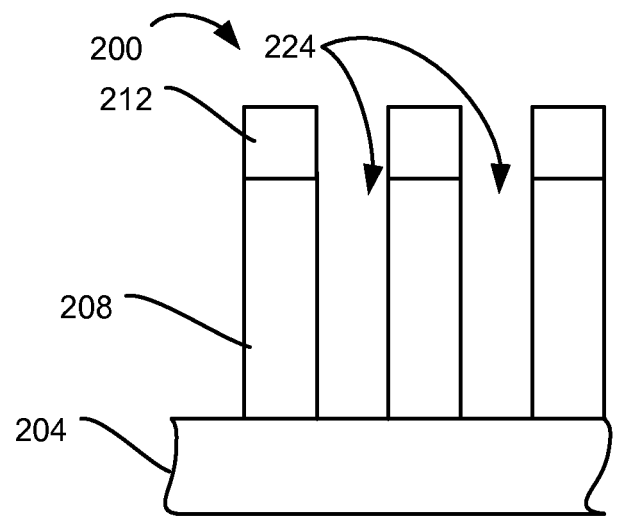

The cycle is continued (step 120) until the etch process is completed. FIG. 2H is a cross-sectional view of the stack 200 after the etching of the at least one metal layer 208 is completed.

This embodiment provides a plasma free etching processes. Other embodiments may use a plasma during the initiation step or the desorption step. Such a plasma may be a downstream plasma provided to the etch chamber 349 from a plasma source or may be created in situ, wherein the etch chamber 349 would require a precursor gas source and a plasma excitation system. In other embodiments an ion flux of $O_2$, COS, or $CH_3OH$ may be used to provide the initiation step. In other embodiments a vapor generated from $H_2O_2$, HClO, $O_3$, $SOCl_2$, $NH_4OH$, HCHO, or $CH_3COOH$ may be used to provide the initiation step. In other embodiments, a catalyst may be used during the reaction step to increase the reaction rate.

Figure 6A:
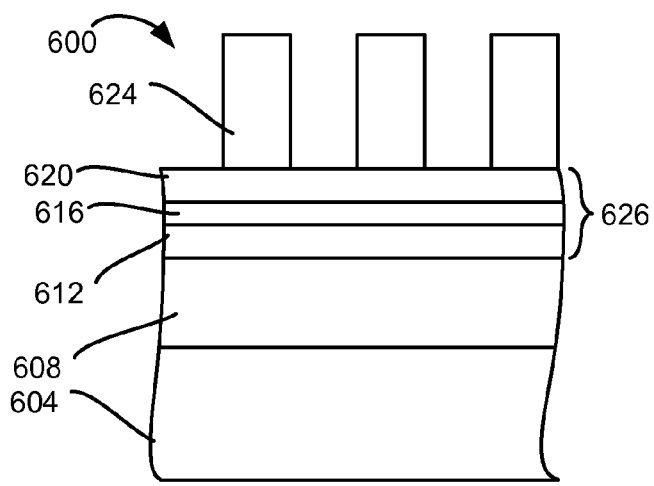
FIGS. 6A-E are schematic views of a MRAM stack processed according to an embodiment of the invention.

FIG. 6A is a schematic cross-sectional view of a stack 600 used in another embodiment of the invention. In this stack 600 an inter layer dielectric layer (ILD) 604 is placed over a substrate, not shown. A bottom electrode 608 is formed over the ILD 604. In this embodiment, the bottom electrode 608 is formed from Ta, Ti, or W. In other embodiments, other similar metals may be used for the bottom electrode 608. A bottom non-volatile metal (NVM) (pinned layer) layer 612 is formed over the bottom electrode 608. In this embodiment, the bottom NVM layer is formed from MnPt, CoPt, CoPd, or CoFe. In other embodiments, other similar alloys may be used for the bottom NVM layer 612. A tunneling layer 616 of magnesium oxide (MgO) is formed over the bottom NVM layer 612. A top NVM layer 620 is formed over the tunneling layer 616. In this embodiment, the top NVM layer 620 is formed from CoFe, CoFeB, Ru, CoPt, or CoPd. In other embodiments the top NVM layer 620 is formed of other metals or alloys. In this embodiment, the combination of the bottom NVM layer 612, the tunneling layer 616, and the top NVM layer 620 forms a magnetic tunnel junction (MTJ). A patterned hardmask 624 is formed over the top NVM layer 620. In this embodiment the patterned hardmask 624 is Ta, TaN, TiN or W, and is used as an electrode. In other embodiments, other electrode materials may be used.

Figure 6B:
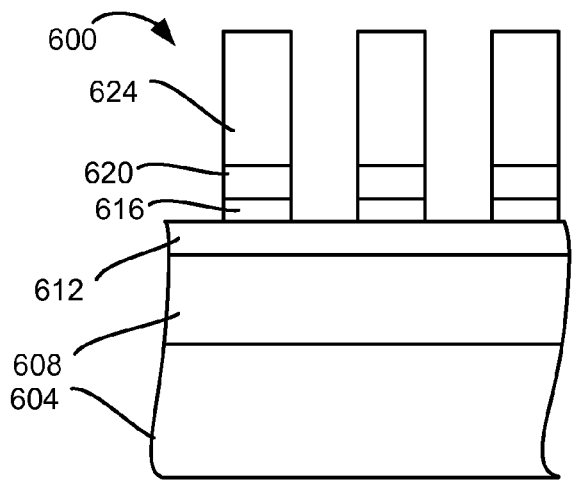

In this embodiment, the top NVM layer 620 and tunneling layer 616 are etched using an RIE or IBE, which in this embodiment etches 2-3 nm of the bottom NVM 612. An IBE etch is able to etch the top NVM layer 620 and tunneling layer 616 without forming sidewall deposition and without damaging the tunneling layer 616. FIG. 6B is a schematic cross-sectional view of the stack after the NVM layer 620 and tunneling 616 have been etched. Using IBE to only etch the top NVM layer 620 and tunneling layer 616 lowers the IBE sidewall angle/aspect ratio limitation while maintaining tunneling layer 616 integrity without deposition build up.

Figure 6C:
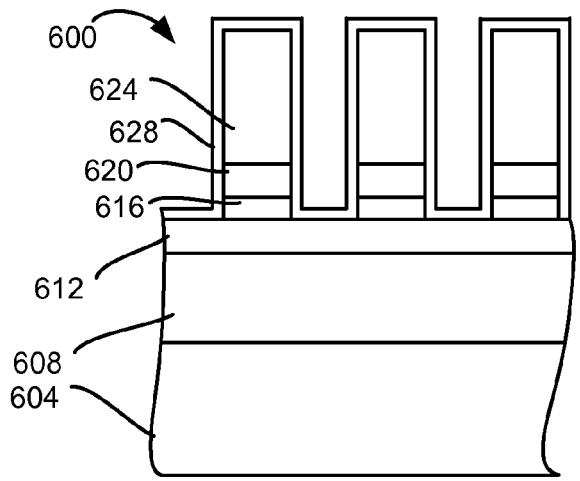
Figure 6D:
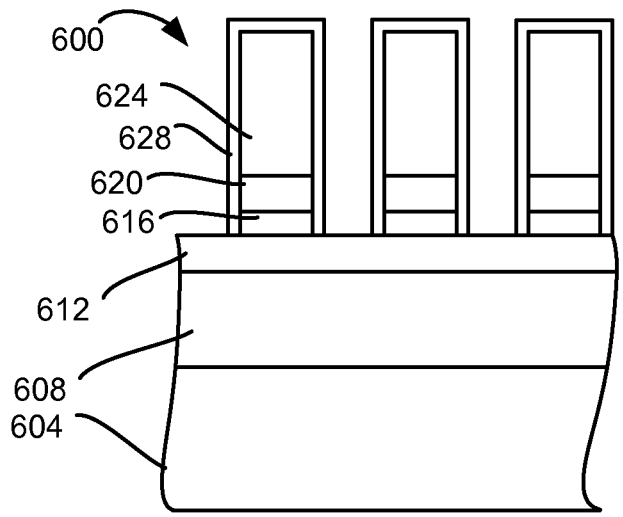

An oxide or nitride spacer is formed around the partially etched stack 600. FIG. 6C is a schematic cross-sectional view of the stack 600 after the spacer 628 has been formed. The spacer seals the tunneling layer 616 during subsequent etching. The spacer thickness is approximately 2 to 5 nm. RIE or IBE sputtering is used to open the spacer 628. FIG. 6D is a schematic cross-sectional view of the stack 600 after the spacer 628 have been opened.

The stack is then subjected to an etch process, as shown in FIG. 1, wherein the patterned hard mask 624, the top NVM layer 620, the tunneling layer 616, and the spacer 628 provide a patterned mask for etching the bottom NVM layer 612. In this example, the initiation step (step 108) is provided by providing an oxidation by providing a pressure of 4 to 80 mTorr. 50 to 500 sccm of $O_2$ and 0 to 500 sccm Ar are flowed into the etch chamber 349. 200 to 1500 TCP power at 13 MHz is provided to form the gas into a plasma. A bias voltage from 20 to 500 volts is provided. The oxidation process is maintained for 5 to 60 seconds. In an alternative embodiment, the initiation step may be provided by chlorination. In such a process a pressure of 4 to 80 mTorr is provided. 50 to 500 sccm of $Cl_2$ and 0 to 500 sccm of Ar is flowed into the etch chamber 349. 200 to 1500 TCP power at 13 MHz is provided to form the gas into a plasma. A bias voltage from 20 to 500 volts is provided. The chlorination process is maintained for 5 to 60 seconds.

In this example, the solvate modified metallic sites step (step 504) is provided by providing a vapor of an organic acid. The ligand complex formation step (step 508) is provided by providing a vapor of a ligand. A pressure of 20 mTorr to 1 Torr is provided during the solvation and ligand complex formation steps with or without a carrier gas, where these steps may be cycled multiple times to enhance the reaction.

Figure 6E:
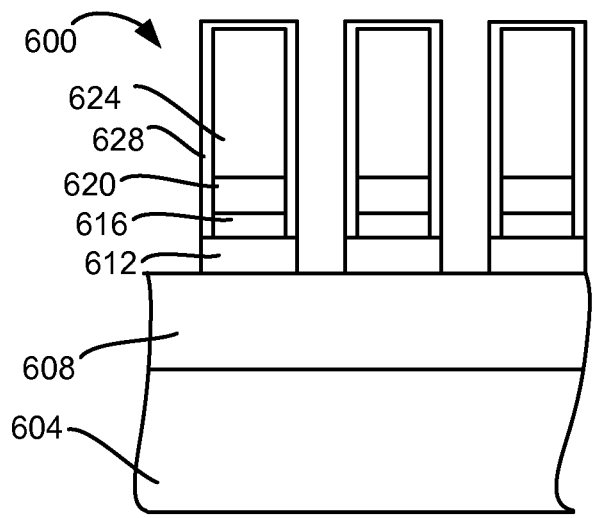

In this example the desorption step (step 116) is provided by providing a light plasma sputtering. In one example, the light plasma sputtering may be accomplished by providing 4 to 80 mTorr of chamber pressure. 50 to 500 sccm Ar is flowed into the etch chamber 349. 200 to 1500 TCP power is provided to form the gas into a plasma. A bias voltage from 0 to 100 volts is provided. The Ar gas may be replaced by He, Ne, or Xe. Preferably, the gas is a pure noble gas. In another example, desorption may be provided by heating the chuck 308 to a temperature of between 80° C. to 300° C. The process is repeated until the etching of the NVM layer 612 is completed. FIG. 6E is a schematic view of the stack 600 after the NVM layer 612 has been etched.

This embodiment uses an IBE to only etch the tunneling layer 616 and to open the spacer, so that the IBE is used for shallower and lower aspect etching. This allows an IBE that does not form sidewall depositions and does not damage the tunneling layer 616. Partially patterning the film stack puts fewer constraints on the IBE sidewall angle/aspect ratio limitation while maintaining MgO integrity without deposition build up. The spacer is able to further protect the MgO layer while etching subsequent layers. This embodiment uses non-aqueous solvents to avoid potential degradation of the MgO layer. This embodiment uses vapors to create organometallic byproducts, which are volatile in nature and leave the wafer surface without excessive sidewall buildup. This allows the formation of high density MRAM patterning with high aspect ratio. This embodiment provides an anisotropic etch of an MRAM with small CD and high aspect ratios. By providing an atomic level etch this embodiment provides greater control of the etching process.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a stack with at least one metal layer in one or more cycles with each cycle comprising:
    performing an initiation step, transforming part of the at least one metal layer into metal oxide, metal halide, or lattice damaged metallic sites; and
    performing a reactive step providing one or more cycles, where each cycle, comprises:
        providing an organic solvent vapor to form a solvated metal, metal halide, or metal oxide state; and
        providing an organic ligand solvent to form volatile organometallic compounds.

2. The method, as recited in claim 1, wherein the providing an organic solvent vapor to form a solvated metal, metal halide, or metal oxide state and providing an organic ligand solvent to form volatile organometallic compounds are performed sequentially.

3. The method, as recited in claim 1, wherein the providing an organic solvent vapor to form a solvated metal, metal halide, or metal oxide state and providing an organic ligand solvent to form volatile organometallic compounds are performed simultaneously.

4. The method, as recited in claim 1, wherein the organic solvent vapor comprises at least one of alcohols, amine, or hydrocarbons.

5. The method, as recited in claim 1, wherein the ligand solvent comprises at least one of acetylacetonate (acac) family, acetic acid, amides, amidinates, allyls, ethylene, acetylene, and cyclo-pentadienyl.

6. A method of etching a stack with at least one metal layer in one or more cycles with each cycle comprising:
    performing an initiation step, transforming part of the at least one metal layer into metal oxide, metal halide, or lattice damaged metallic sites; and
    performing a reactive step comprising providing an organic solvent vapor to form a solvated metal, metal halide, or metal oxide state or providing an organic ligand solvent to form volatile organometallic compounds.

7. The method, as recited in claim 6, further comprising performing a desorption of the volatile organometallic compounds.

8. The method, as recited in claim 7, wherein the performing the desorption, comprises heating the organometallic compounds.

9. The method, as recited in claim 6, wherein the organic solvent vapor comprises at least one of alcohols, amine, or hydrocarbons.

10. The method, as recited in claim 6, wherein the ligand solvent comprises at least one of acetylacetonate (acac) family, acetic acid, amides, amidinates, allyls, ethylene, acetylene, and cyclo-pentadienyl.

11. A method of etching a stack with at least one metal layer in one or more cycles with each cycle comprising:
    performing an initiation step, transforming part of the at least one metal layer into metal oxide, metal halide, or lattice damaged metallic sites; and
    performing a reactive step comprising providing an organic solvent vapor to form a solvated metal, metal halide, or metal oxide state.

12. The method, as recited in claim 11, further comprising performing a desorption of volatile organometallic compounds.

13. The method, as recited in claim 12, wherein the performing the desorption, comprises heating the organometallic compounds.

14. The method, as recited in claim 11, wherein the organic solvent vapor comprises at least one of alcohols, amine, or hydrocarbons.

15. The method, as recited in claim 11, further comprising forming a patterned mask, comprising:
    etching a magnetic tunnel junction layer formed over the stack with an ion beam etch or reactive ion etch;
    forming a spacer layer over the magnetic tunnel junction layer; and
    opening the spacer layer.

16. A method of etching a stack with at least one metal layer in one or more cycles with each cycle comprising:
    performing an initiation step, transforming part of the at least one metal layer into metal oxide, metal halide, or lattice damaged metallic sites; and
    performing a reactive step providing an organic ligand solvent to form volatile organometallic compounds.

17. The method, as recited in claim 16, further comprising performing a desorption of the volatile organometallic compounds.

18. The method, as recited in claim 17, wherein the performing the desorption, comprises heating the organometallic compounds.

19. The method, as recited in claim 16, wherein the ligand solvent comprises at least one of acetylacetonate (acac) family, acetic acid, amides, amidinates, allyls, ethylene, acetylene, and cyclo-pentadienyl.

20. The method, as recited in claim 16, further comprising forming a patterned mask, comprising:
    etching a magnetic tunnel junction layer formed over the stack with an ion beam etch or reactive ion etch;
    forming a spacer layer over the magnetic tunnel junction layer; and
    opening the spacer layer.

* * * * *